(12) United States Patent
Chan et al.

(10) Patent No.: US 8,981,209 B2
(45) Date of Patent: Mar. 17, 2015

(54) PHOTOVOLTAIC MODULE

(75) Inventors: I-Min Chan, Hsin-Chu (TW); Chi-Lin Chen, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 378 days.

(21) Appl. No.: 13/478,345

(22) Filed: May 23, 2012

(65) Prior Publication Data

US 2013/0098422 A1 Apr. 25, 2013

(30) Foreign Application Priority Data

Oct. 20, 2011 (TW) .............................. 100138114 A

(51) Int. Cl.
*H01L 31/05* (2014.01)
*H01L 31/02* (2006.01)
*H01L 31/0465* (2014.01)

(52) U.S. Cl.
CPC ........... *H01L 31/02013* (2013.01); *Y02E 10/50* (2013.01); *H01L 31/05* (2013.01); *H01L 31/0201* (2013.01); *H01L 31/0465* (2014.12)
USPC .......................................... 136/256; 136/252

(58) Field of Classification Search
CPC ................................ H01L 31/05; H01L 31/02
USPC ........................................ 136/252, 256, 244
See application file for complete search history.

(56) References Cited

U.S. PATENT DOCUMENTS

| 5,593,901 A | 1/1997 | Oswald et al. |
| 2002/0139411 A1 | 10/2002 | Hiraishi et al. |
| 2007/0144577 A1 | 6/2007 | Rubin et al. |
| 2008/0142070 A1 | 6/2008 | Lechner et al. |
| 2009/0260671 A1 | 10/2009 | Green et al. |
| 2009/0288702 A1 | 11/2009 | Kim et al. |
| 2010/0132759 A1 | 6/2010 | Jia et al. |
| 2010/0190275 A1 | 7/2010 | Repmann et al. |
| 2010/0197051 A1 | 8/2010 | Schlezinger et al. |
| 2010/0263719 A1 | 10/2010 | Straub et al. |
| 2011/0265845 A1 | 11/2011 | Nasuno et al. |
| 2012/0138143 A1 | 6/2012 | Yagiura |

FOREIGN PATENT DOCUMENTS

| CN | 1023433 C | 1/1994 |
| CN | 101587914 | 11/2009 |
| CN | 101785112 | 7/2010 |
| JP | 2002-246628 | 8/2002 |
| JP | 2002-373997 | 12/2002 |
| JP | 2005-353767 | 12/2005 |
| TW | I298953 | 7/2008 |
| TW | I313068 | 8/2009 |
| TW | 201006090 | 2/2010 |
| TW | 201027776 | 7/2010 |
| WO | 2010/079770 | 7/2010 |
| WO | 2011/052479 | 5/2011 |

*Primary Examiner* — Susan D Leong
(74) *Attorney, Agent, or Firm* — WPAT, PC; Justin King

(57) ABSTRACT

A photovoltaic module includes a substrate, a plurality of cell sets, a first collecting electrode and a second collecting electrode. The cell sets are disposed on the substrate. Each of the cell sets includes a plurality of cell units, a bottom connecting electrode and an upper connecting electrode. The plurality of cell units are electrically connected to each other in series. The cell units are electrically connected between the bottom connecting electrode and the upper connecting electrode. The first collecting electrode is disposed on the substrate and is electrically connected to the bottom connecting electrode of every cell set. The second collecting electrode is disposed on the substrate and is electrically connected to the upper connecting electrode of every cell set. The second collecting electrode and the cell sets are substantially made of the same layer.

30 Claims, 7 Drawing Sheets

PHOTOVOLTAIC MODULE

RELATED APPLICATIONS

This application claims priority to Taiwan Application Serial Number 100138114, filed Oct. 20, 2011, which is herein incorporated by reference.

BACKGROUND

1. Technical Field

The present disclosure relates to a photovoltaic module. More particularly, the present disclosure relates to a photovoltaic module, in which cell sets are electrically connected in parallel.

2. Description of Related Art

A photovoltaic module is a device to transform light into electricity by the photovoltaic effect. In recent years, the photovoltaic industry develops so rapidly because every country works hard to promote renewable energy.

Currently, a low voltage photovoltaic module is manufactured by a laser process to complete the layout of common electrodes at front end and then by a module process to electrically connect the common electrodes by ribbons across a part of cell units of cell sets. However, this approach requires the ribbons to be bonded on a part of the cell units of the cell sets, and thus the whole lay-up structure of the photovoltaic module is very complicated. The complicated lay-up structure affects the yield of the module process and the lamination process. The hardware cost also increases. In addition, the module cost also increases because the ribbons are needed to connect the common electrodes. Furthermore, it causes a waste that a part of the cell units are shielded by the ribbons and thus are unable to generate electricity because the ribbons must be across a part of the cell units of the cell sets.

SUMMARY

Therefore, in one aspect, the present invention provides a photovoltaic module having a plurality of cell sets electrically connected in parallel to supply a stable and large photocurrent.

In another aspect, the photovoltaic module of the present invention at least has a collecting electrode and a plurality of cell sets, wherein the collecting electrode and the cell set are substantially made of the same layer. The compacted photovoltaic module of the present invention makes the structure simple and stable, and the manufacture cost can be therefore reduced.

According to one embodiment of the present invention, a photovoltaic module includes a substrate, a first cell set, a second cell set, a first collecting electrode and a second collecting electrode. The first cell set is disposed on the substrate. The first cell set includes a plurality of first cell units, a first bottom connecting electrode and a first upper connecting electrode. The plurality of first cell units are electrically connected to each other in series. The first cell units are electrically connected between the first bottom connecting electrode and the first upper connecting electrode. The second cell set is disposed on the substrate. The second cell set includes a plurality of second cell units, a second bottom connecting electrode and a second upper connecting electrode. The plurality of second cell units are electrically connected to each other in series. The second cell units are electrically connected between the second bottom connecting electrode and the second upper connecting electrode. The first collecting electrode is disposed on the substrate and electrically connects the first bottom connecting electrode and the second bottom connecting electrode. The second collecting electrode is disposed on the substrate and electrically connects the first upper connecting electrode and the second upper connecting electrode. The first collecting electrode, the second collecting electrode, the first cell set and the second cell set are substantially made of the same layer.

In one or more embodiments of the present invention, the substrate includes a transparent substrate, a glass substrate, a plastic substrate, a silicon substrate, a hard substrate, a flexible substrate or any combinations thereof.

In one or more embodiments of the present invention, each of the first cell unit and the second cell unit includes a transparent electrode, a back electrode and a photovoltaic layer. The photovoltaic layer is located between the transparent electrode and the back electrode.

In one or more embodiments of the present invention, one of the transparent electrode and the back electrode is disposed on the substrate.

In one or more embodiments of the present invention, the first bottom connecting electrode is connected to one of the transparent electrode and the back electrode and the first upper connecting electrode is connected to the other of the transparent electrode and the back electrode.

In one or more embodiments of the present invention, the first collecting electrode is disposed between the first cell set and the second cell set and the second collecting electrode is disposed around the first cell set and the second cell set.

In one or more embodiments of the present invention, the second collecting electrode is not across the first cell set and the second cell set.

In one or more embodiments of the present invention, the second collecting electrode is an integrally formed conductive layer.

In one or more embodiments of the present invention, the second collecting electrode includes a stack of a transparent conductive layer, a photovoltaic layer and a conductive metal layer.

In one or more embodiments of the present invention, the second collecting electrode includes two branch electrode parts and a cross-connected electrode part. The branch electrode parts are electrically connected to the first upper connecting electrode and the second upper connecting electrode. The cross-connected electrode part electrically connects the two branch electrode parts.

In one or more embodiments of the present invention, the photovoltaic module further includes an isolation line. The isolation line is disposed between the cross-connected electrode part of the second collecting electrode and the first cell set and the second cell set for electrically isolated therebetween.

In one or more embodiments of the present invention, the first collecting electrode includes a stack of a transparent conductive layer, a photovoltaic layer and a conductive metal layer.

In one or more embodiments of the present invention, the photovoltaic module further includes a first leading-out electrode, a second leading-out electrode and a patterned insulation layer. The first leading-out electrode is electrically connected to the first collecting electrode. The second leading-out electrode is electrically connected to the second collecting electrode. The patterned insulation layer is disposed between a combination of the first leading-out electrode and the second leading-out electrode and another combination of the first cell set and the second cell set.

In one or more embodiments of the present invention, the photovoltaic module further includes a first auxiliary electrode and a second auxiliary electrode. The first auxiliary electrode and the second auxiliary electrode are respectively disposed on the first collecting electrode and the second collecting electrode.

According to another embodiment of the present invention, a photovoltaic module includes a substrate, a plurality of cell sets, a first connecting electrode and a second connecting electrode. The cell sets is disposed on the substrate. Each of the cell sets includes a plurality of cell units, a bottom connecting electrode and an upper connecting electrode. The plurality of cell units are electrically connected to each other in series. The cell units are electrically connected between the bottom connecting electrode and the upper connecting electrode. The first collecting electrode is disposed on the substrate and is electrically connected to the bottom connecting electrode of every cell set. The second collecting electrode is disposed on the substrate and is electrically connected to the upper connecting electrode of every cell set. The second collecting electrode and the cell sets are substantially made of the same layer.

In one or more embodiments of the present invention, the substrate includes a transparent substrate, a glass substrate, a plastic substrate, a silicon substrate, a hard substrate, a flexible substrate or any combinations thereof.

In one or more embodiments of the present invention, the cell units include a transparent electrode, a back electrode and a photovoltaic layer. The photovoltaic layer is located between the transparent electrode and the back electrode.

In one or more embodiments of the present invention, one of the transparent electrode and the back electrode is disposed on the substrate.

In one or more embodiments of the present invention, the bottom connecting electrode is connected to one of the transparent electrode and the back electrode and the upper connecting electrode is connected to the other of the transparent electrode and the back electrode.

In one or more embodiments of the present invention, the first collecting electrode includes a stack of a transparent conductive layer, a photovoltaic layer and a conductive metal layer.

In one or more embodiments of the present invention, the first collecting electrode includes a plurality of branch electrode parts and a cross-connected electrode part. The branch electrode parts are electrically connected to the upper connecting electrodes. The cross-connected electrode part electrically connects these branch electrode parts.

In one or more embodiments of the present invention, the photovoltaic module further includes an isolation line. The isolation line is disposed between the cell sets and the cross-connected electrode part of the first collecting electrode for electrically isolated therebetween.

In one or more embodiments of the present invention, the first collecting electrode is an integrally formed conductive layer.

In one or more embodiments of the present invention, the first collecting electrode is not across the cell sets.

In one or more embodiments of the present invention, the second collecting electrode includes a stack of a transparent conductive layer, a photovoltaic layer and a conductive metal layer.

In one or more embodiments of the present invention, the second collecting electrode includes a plurality of branch electrode parts and a cross-connected electrode part. The branch electrode parts are electrically connected to the upper connecting electrodes. The cross-connected electrode part electrically connects these branch electrode parts.

In one or more embodiments of the present invention, the photovoltaic module further includes an isolation line. The isolation line is disposed between the cell sets and the cross-connected electrode part of the second collecting electrode for electrically isolated therebetween.

In one or more embodiments of the present invention, the second collecting electrode is not across the cell sets.

In one or more embodiments of the present invention, the first collecting electrode is across at least a part of the cell sets.

In one or more embodiments of the present invention, the second collecting electrode is an integrally formed conductive layer.

In one or more embodiments of the present invention, the photovoltaic module further includes a first leading-out electrode, a second leading-out electrode and a patterned insulation layer. The first leading-out electrode is electrically connected to the first collecting electrode. The second leading-out electrode is electrically connected to the second collecting electrode. The patterned insulation layer is disposed between a combination of the first leading-out electrode and the second leading-out electrode and the cell sets.

In one or more embodiments of the present invention, the photovoltaic module further includes a first auxiliary electrode and a second auxiliary electrode. The first auxiliary electrode and the second auxiliary electrode are respectively disposed on the first collecting electrode and the second collecting electrode.

DETAILED DESCRIPTION

Figure 1:
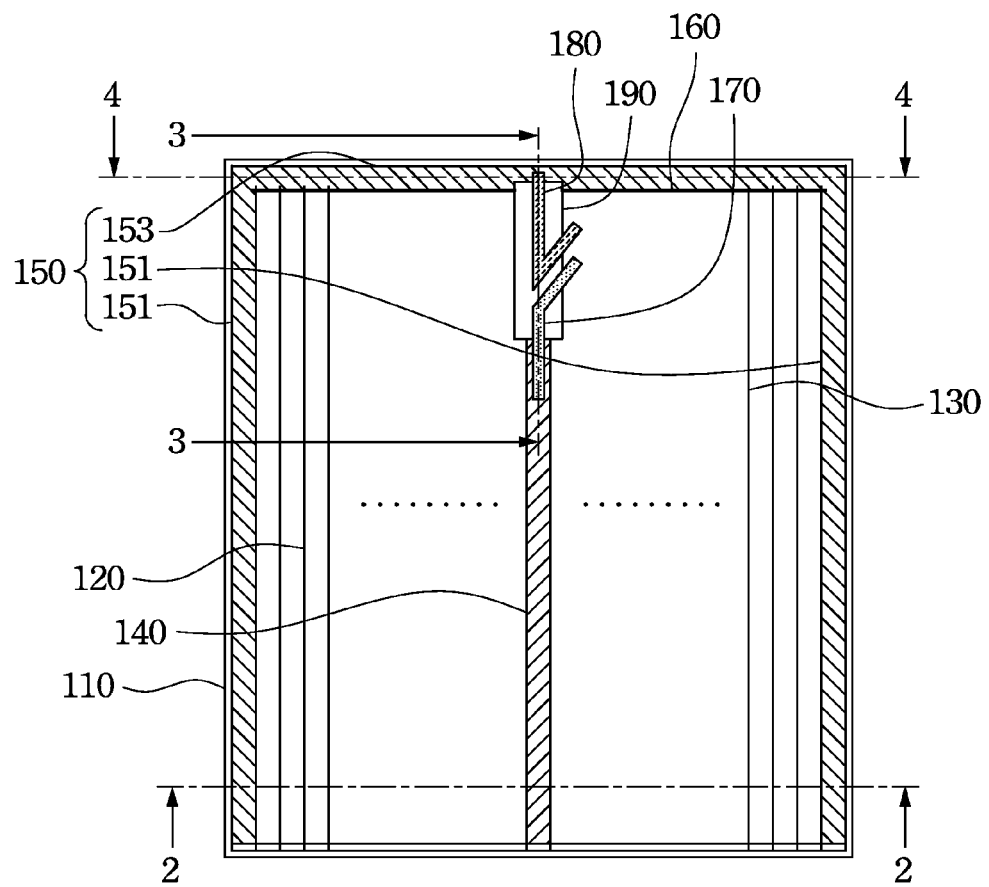
FIG. 1 is a top view of a photovoltaic module according to the first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First Embodiment

Figure 2:
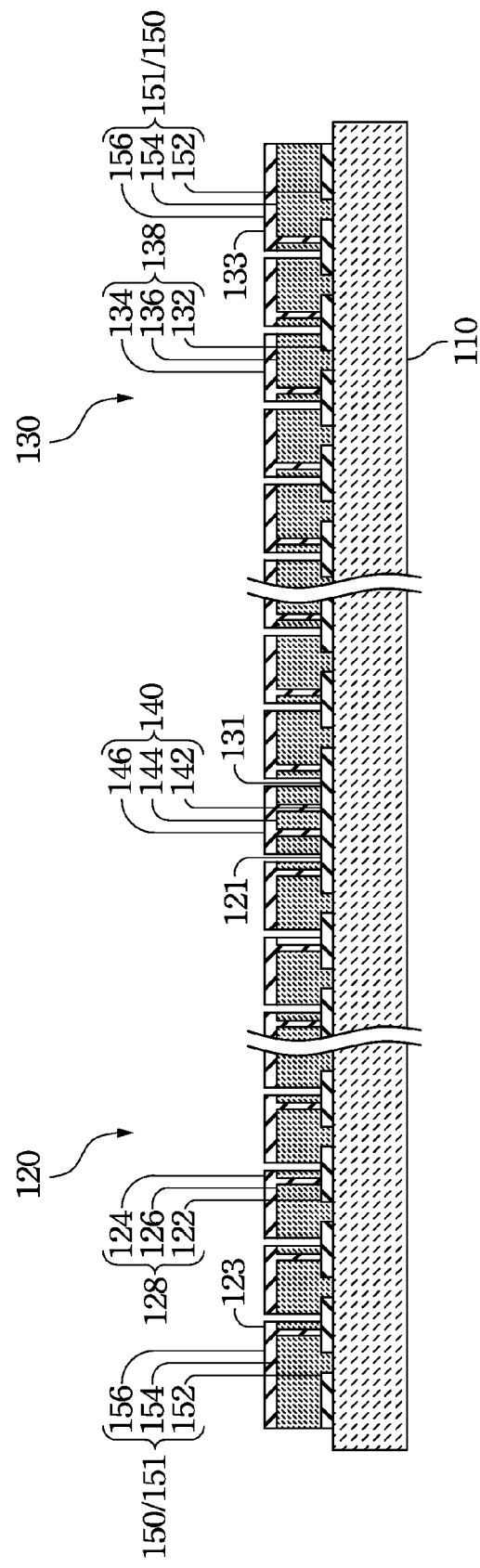
FIG. 2 is a sectional view taken along line 2-2 of FIG. 1.

FIG. 1 is a top view of a photovoltaic module according to the first embodiment of the present invention. FIG. 2 is a sectional view taken along line 2-2 of FIG. 1. As shown in FIGS. 1 and 2, a photovoltaic module includes a substrate 110, a first cell set 120, a second cell set 130, a first collecting electrode 140 and a second collecting electrode 150. The first cell set 120 is disposed on the substrate 110. The first cell set 120 includes a plurality of first cell units 128, a first bottom connecting electrode 121 and a first upper connecting electrode 123. The plurality of first cell units 128 are electrically connected to each other in series. The first cell units 128 are electrically connected between the first bottom connecting electrode 121 and the first upper connecting electrode 123. The second cell set 130 is disposed on the substrate 110. The second cell set 130 includes a plurality of second cell units 138, a second bottom connecting electrode 131 and a second upper connecting electrode 133. The plurality of second cell units 138 are electrically connected to each other in series. The second cell units 138 are electrically connected between the second bottom connecting electrode 131 and the second upper connecting electrode 133. The first collecting electrode 140 is disposed on the substrate 110 and electrically connects the first bottom connecting electrode 121 and the second bottom connecting electrode 131. The second collecting electrode 150 is disposed on the substrate 110 and electrically connects the first upper connecting electrode 123 and the second upper connecting electrode 133. The second collecting electrode 150, the first cell set 120 and the second cell set 130 are substantially made of the same layer. In other words, the second collecting electrode 150 can be made of substantially the same stack of layers or materials as the first cell set 120 and the second cell set 130 or only partially the same stack of layers or materials as the first cell set 120 and the second cell set 130.

To be specific, the first collecting electrode 140 and the second collecting electrode 150 can electrically connect the first cell set 120 and the second cell set 130 in parallel to supply a larger and more stable electrical current. The first collecting electrode 140, the second collecting electrode 150, the first cell set 120 and the second cell set 130 can be formed together by patterning a transparent layer, a photovoltaic layer and a conductive metal layer on the substrate 110. Therefore, in the first embodiment, it is unnecessary to attach additional ribbons on the first collecting electrode 140 and the second collecting electrode 150 so that the complexity of the lay-up structure can be reduced, and thus the process yield problem resulting from the overcomplicated lay-up structure may be further improved. In addition, the hardware cost and the module cost can be further reduced as well.

The substrate 110 can be any substrate which supplies enough structural support. The substrate 110 includes, but is not limited to, a transparent substrate, a glass substrate, a plastic substrate, a silicon substrate, a hard substrate, a flexible substrate or any combinations thereof. It should be understood that the aforementioned specific types of the substrate 110 are for examples only and should not limit the claimed scope of the present invention. The person having ordinary skill in the art may select a proper substrate depending on actual requirements.

Each of the first cell units 128 may include a transparent electrode 122, a back electrode 124 and a photovoltaic layer 126. The photovoltaic layer 126 is located between the transparent electrode 122 and the back electrode 124. In the first embodiment, the material of the transparent electrode 122 may include, but be not limited to, indium tin oxide, indium zinc oxide, aluminum zinc oxide or any combinations thereof. The material of the back electrode 124 may include, but be not limited to, a conductive material, metal, aluminum, copper or any combinations thereof. The material of the photovoltaic layer 126 may include, but be not limited to, monocrystalline silicon, polycrystalline silicon, amorphous silicon, cadmium telluride, copper indium gallium selenide, gallium arsenide, photochemical photovoltaic material, dye-sensitized photovoltaic material, polymer photovoltaic material, nanocrystalline photovoltaic material, or any combinations thereof. In one embodiment, when the substrate 110 is made of a transparent material, one of the transparent electrode 122 and the back electrode 124 can be chosen to be disposed on the substrate 110. In another embodiment, when the substrate 110 is made of an opaque material, the back electrode 124 can be chosen to be disposed on the substrate 110.

Similarly, each of the second cell units 138 may also include a transparent electrode 132, a back electrode 134 and a photovoltaic layer 136, and the structure cooperation among the transparent electrode 132, the back electrode 134 and the photovoltaic layer 136 is substantially the same as the aforementioned embodiment. The photovoltaic layer 136 is located between the transparent electrode 132 and the back electrode 134. In the first embodiment, the material of the transparent electrode 132 may include, but be not limited to, indium tin oxide, indium zinc oxide, aluminum zinc oxide or any combinations thereof. The material of the back electrode 134 may include, but be not limited to, a conductive material, metal, aluminum, copper or any combinations thereof. The material of the photovoltaic layer 136 may include, but be not limited to, monocrystalline silicon, polycrystalline silicon, amorphous silicon, cadmium telluride, copper indium selenide, copper indium gallium selenide, gallium arsenide, photochemical photovoltaic material, dye-sensitized photovoltaic material, polymer photovoltaic material, nanocrystalline photovoltaic material, or any combinations thereof.

In addition, the first collecting electrode 140 may include a stack of a transparent layer 142, a photovoltaic layer 144 and a conductive metal layer 146. In an alternative embodiment, the first collecting electrode 140 may be replaced with only a part of the stack of the transparent layer 142, the photovoltaic layer 144 and the conductive metal layer 146. In the first embodiment, the material of the transparent electrode 142 may include, but be not limited to, indium tin oxide, indium zinc oxide, aluminum zinc oxide or any combinations thereof. The material of the photovoltaic layer 144 may include, but be not limited to, monocrystalline silicon, polycrystalline silicon, amorphous silicon, cadmium telluride, copper indium selenide, copper indium gallium selenide, gallium arsenide, photochemical photovoltaic material, dye-sensitized photovoltaic material, polymer photovoltaic material, nanocrystalline photovoltaic material, or any combinations thereof. The material of the conductive metal layer 146 may include, but be not limited to, a conductive material, metal, aluminum, copper or any combinations thereof.

Although the first collecting electrode 140 of FIG. 2 is the stack of the transparent conductive layer 142, the photovoltaic layer 144 and the conductive metal layer 146, only the conductive metal layer 146 is enough to provide an to electrical connection between the first bottom connecting electrode 121 and the second bottom connecting electrode 131. Therefore, in the first embodiment, only the conductive metal layer 146 may be considered the first collecting electrode 140 as well. The conductive metal layer 146 within the first collecting electrode 140 is integrally formed to provide a collecting function. In addition, in some embodiments of the present invention, manufactures may omit the transparent conductive layer 142 and the photovoltaic layer 144 and dispose the conductive metal layer 146 on the substrate 110 alone to be the first collecting electrode 140. Alternatively, in some embodiments of the present invention, the manufactures may omit the photovoltaic layer 144 and dispose a stack of the transparent conductive layer 142 and the conductive metal layer 146 alone to be the first collecting electrode 140.

Similarly, each of the second collecting electrodes 150 may include a stack of a transparent conductive layer 152, a photovoltaic layer 154 and a conductive metal layer 156 as well. In the first embodiment, the material of the transparent conductive layer 152 may include, but be not limited to, indium tin oxide, indium zinc oxide, aluminum zinc oxide or any combinations thereof. The material of the photovoltaic layer 154 may include, but be not limited to, monocrystalline silicon, polycrystalline silicon, amorphous silicon, cadmium telluride, copper indium selenide, copper indium gallium selenide, gallium arsenide, photochemical photovoltaic material, dye-sensitized photovoltaic material, polymer photovoltaic material, nanocrystalline photovoltaic material, or any combinations thereof. The material of the conductive metal layer 156 may include, but be not limited to, a conductive material, metal, aluminum, copper or any combinations thereof.

Although the second collecting electrode 150 of FIG. 2 is the stack of the transparent conductive layer 152, the photovoltaic layer 154 and the conductive metal layer 156, or the second collecting electrode 150 of FIG. 2 may be a part of the stack of the transparent conductive layer 152, the photovoltaic layer 154 and the conductive metal layer 156, only the conductive metal layer 156 is enough to provide an electrical connection between the first upper connecting electrode 123 and the second upper connecting electrode 133. Therefore, in the first embodiment, only the conductive metal layer 156 may be considered the second collecting electrode 150 as well. The conductive metal layer 156 within the second collecting electrode 150 is integrally formed to provide a collecting function. In addition, in some embodiments of the present invention, manufactures may omit the transparent conductive layer 152 and the photovoltaic layer 154 and dispose the conductive metal layer 156 on the substrate 110 alone to be the second collecting electrode 150. Alternatively, in some embodiments of the present invention, the manufactures may omit the photovoltaic layer 154 and dispose a stack of the transparent conductive layer 152 and the conductive metal layer 156 alone to be the second collecting electrode 150.

In the first embodiment, since the first cell set 120, the second cell set 130, the first collecting electrode 140 and the second collecting electrode 150 are formed together by patterning the transparent conductive layer, the photovoltaic layer and the conductive metal layer on the substrate 110, the material of the transparent electrode 122 of each of the first cell units 128, the transparent electrode 132 of each of the second cell units 138, the transparent conductive layer 142 of the first collecting electrode 140 and the transparent conductive layer 152 of the second collecting electrode 150 are the same. In addition, the material of the back electrode 124 of each of the first cell units 128, the back electrode 134 of each of the second cell units 138, the conductive metal layer 146 of the first collecting electrode 140 and the conductive metal layer 156 of the second collecting electrode 150 are the same. Furthermore, the material of the photovoltaic layer 126 of each of the first cell units 128, the photovoltaic layer 136 of each of the second cell units 138, the photovoltaic layer 144 of the first collecting electrode 140 and the photovoltaic layer 154 of the second collecting electrode 150 are also the same.

It should be understood that although the transparent electrodes 122/132 of FIG. 2 are disposed on the substrate 110, this should not limit the claimed scope of the present invention. When the substrate 110 is a transparent substrate, the manufacturers may choose the transparent electrodes 122/132 to be disposed on the substrate 110 so that light is allowed to be transmitted from a side of the substrate 110 into the photovoltaic layers 126/136. But, in some embodiments of the present invention, when the substrate 110 is an opaque backboard, the manufacturers may choose the back electrodes 124/134 to be disposed on the substrate 110 and dispose the transparent electrodes 122/132 and a transparent substrate opposite the back electrodes 124/134 and the opaque backboard.

In addition, although the first bottom connecting electrode 121 and the second bottom connecting electrode 131 of FIG. 2 are electrically connected to the back electrodes 124/134, and the first upper connecting electrode 123 and the second upper connecting electrode 133 are electrically connected to the transparent electrodes 122/132, these should not limit the claimed scope of the present invention. In the embodiment that the substrate 110 is the opaque backboard, since the back electrodes 124/134 is disposed on the substrate 110, the first bottom connecting electrode 121 and the second bottom connecting electrode 131 are electrically connected to the transparent electrodes 122/132, and the first upper connecting electrode 123 and the second upper connecting electrode 133 are electrically connected to the back electrodes 124/134.

Reference is made to FIG. 1. In the first embodiment, the first collecting electrode 140 is disposed between the first cell set 120 and the second cell set 130. The second collecting electrode 150 is disposed around the first cell set 120 and the second cell set 130. To be specific, the second collecting electrode 150 may include a plurality of branch electrode parts 151 (there are two branch electrode parts 151 in FIG. 1) and a cross-connected electrode part 153. The branch electrode parts 151 are electrically connected to the first upper connecting electrode 123 and the second upper connecting electrode 133 respectively (as shown in FIG. 2). The cross-connected electrode part 153 electrically connects the branch electrode parts 151.

In FIG. 1, the first collecting electrode 140 is disposed between the first cell set 120 and the second cell set 130. The branch electrode parts 151 of the second collecting electrode 150 are respectively disposed on opposite sides of the first cell set 120 and the second cell set 130. The cross-connected electrode part 153 of the second collecting electrode 150 is disposed at an edge which lies on the same horizontal plane with the first cell set 120 and the second cell set 130. For example, the cross-connected electrode part 153 of the second collecting electrode 150 of FIG. 1 is disposed at an upper edge. In other embodiments, the cross-connected electrode part 153 of the second collecting electrode 150 can be disposed at other edge as well. Namely, the first collecting electrode 140 and the second collecting electrode 150 are not vertically across any of the first cell units 128 of the first cell set 120 and/or any of the second cell units 138 of the second cell set 130. Therefore, all of the first cell units 128 of the first cell set 120 and all of the second cell units 138 of the second cell set 130 are used to generate electricity. No cell unit is shielded by ribbons and thus unable to generate electricity.

In the first embodiment, both sides of any of the cell sets (for example, the first cell set 120 and the second cell set 130) may be electrically connected to different collecting electrodes (for example, the first collecting electrode 140 and the second collecting electrode 150) which are responsible for the anode and cathode electric potentials respectively. In the first embodiment, the first collecting electrode 140 is responsible for the anode electric potential. The second collecting electrode 150 is responsible for the cathode electric potential. But, in other embodiments, the first collecting electrode 140 may be responsible for the cathode electric potential. The second collecting electrode 150 may be responsible for the anode electric potential.

Figure 3:
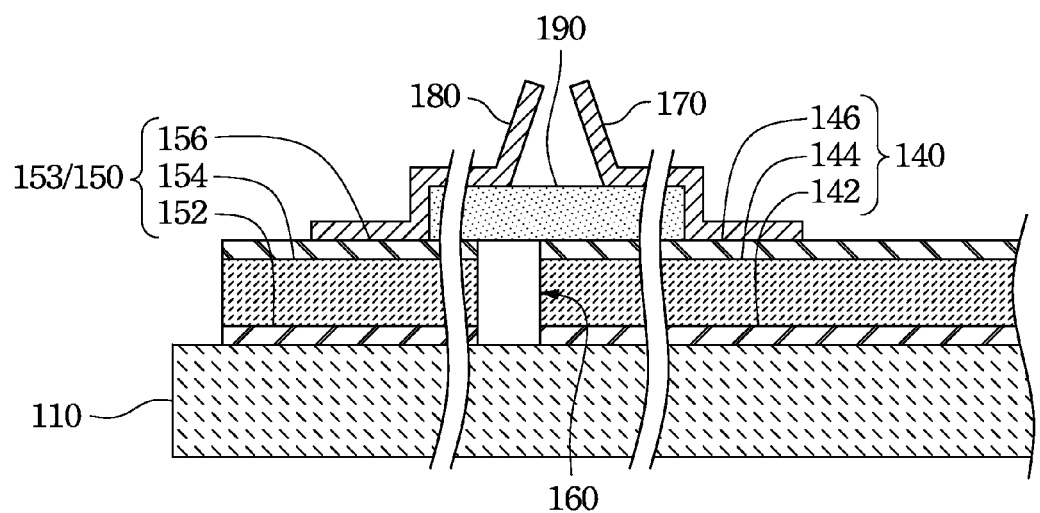
FIG. 3 is a sectional view taken along line 3-3 of FIG. 1.

FIG. 3 is a sectional view taken along line 3-3 of FIG. 1. Reference is made to FIGS. 1 and 3. In the first embodiment, the electric isolation between the cross-connected electrode part 153 of the second collecting electrode 150 and the first cell set 120 and the second cell set 130 is accomplished by an isolation line 160. The isolation line 160 is disposed between the cross-connected electrode part 153 of the second collecting electrode 150 and the first cell set 120, the second cell set 130 and the first collecting electrode 140 for electrically isolated therebetween. To be specific, the isolation line 160 may be a groove through all layers on the substrate 110. In manufacture, the manufacturers may utilize laser cutting, photolithography, or any combinations thereof to manufacture the isolation line 160. The isolation line 160 may fill with an electric insulation material or a following encapsulating material, but these should not limit the claimed scope of the present invention.

Figure 4:
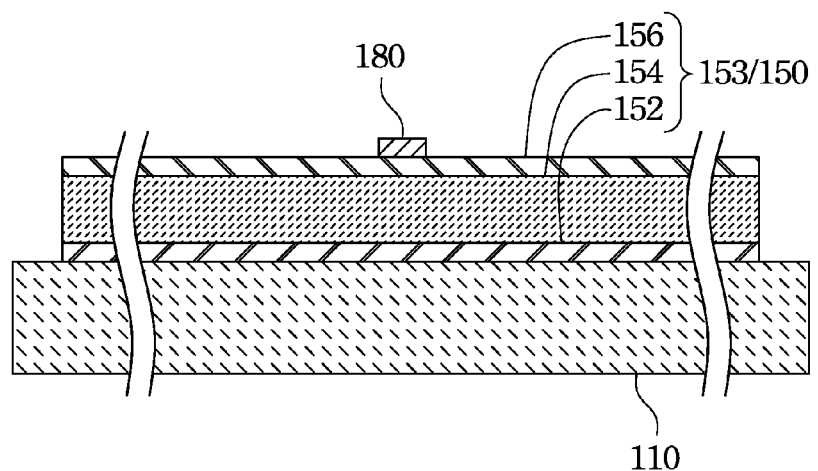
FIG. 4 is a sectional view taken along line 4-4 of FIG. 1.

FIG. 4 is a sectional view taken along line 4-4 of FIG. 1. Reference is made to FIGS. 1, 3 and 4. In the first embodiment, the photovoltaic module may further include a first leading-out electrode 170, a second leading-out electrode 180 and a patterned insulation layer 190. The first leading-out electrode 170 is electrically connected to the first collecting electrode 140. The second leading-out electrode 180 is electrically connected to the second collecting electrode 150. The patterned insulation layer 190 is disposed between a combination of the first leading-out electrode 170 and the second leading-out electrode 180 and another combination of the first cell set 120 and the second cell set 130.

In practice, the first leading-out electrode 170 and the second leading-out electrode 180 may be ribbons, photovoltaic ribbons, tin-plated copper tapes, tin-coated copper tapes, or any combinations thereof. It should be understood that the materials of the first leading-out electrode 170 and the second leading-out electrode 180 are for example only and should not limit the claimed scope of the present invention. The person having ordinary skill in the art may select a proper first leading-out electrode and/or a proper second leading-out electrode depending on actual requirements.

Second Embodiment

Figure 5:
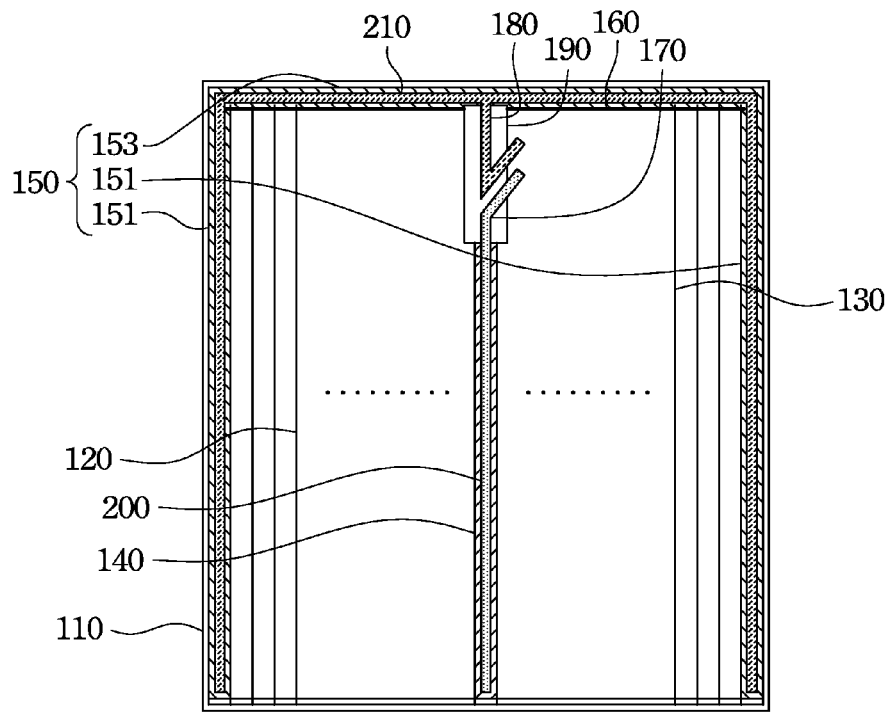
FIG. 5 is a top view of a photovoltaic module according to the second embodiment of the present invention.

FIG. 5 is a top view of a photovoltaic module according to the second embodiment of the present invention. The difference between the second embodiment and the first embodiment is that the photovoltaic module of the second embodiment further includes a first auxiliary electrode 200 and a second auxiliary electrode 210. The first auxiliary electrode 200 and the second auxiliary electrode 210 are disposed on the first collecting electrode 140 and the second collecting electrode 150 respectively and almost cover the entire area of the first collecting electrode 140 and the second collecting electrode 150 to improve the conductivity of the first collecting electrode 140 and the second collecting electrode 150.

In practice, the first auxiliary electrode 200 and the second auxiliary electrode 210 may be ribbons, photovoltaic ribbons, tin-plated copper tapes, tin-coated copper tapes, or any combinations thereof. It should be understood that the materials of the first auxiliary electrode 200 and the second auxiliary electrode 210 are for example only and should not limit the claimed scope of the present invention. The person having ordinary skill in the art may select a proper first auxiliary electrode and/or a second auxiliary electrode depending on actual requirements.

For manufacturing convenience, the first auxiliary electrode 200 and the first leading-out electrode 170 may be an integrally formed ribbon. The second auxiliary electrode 210 and the second leading-out electrode 180 may be an integrally formed ribbon. However, these should not limit the claimed scope of the present invention. In other embodiments of the present invention, the first auxiliary electrode 200 and the first leading-out electrode 170 may be two independent ribbons electrically connected to each other, and the second auxiliary electrode 210 and the second leading-out electrode 180 may be two independent ribbons electrically connected to each other as well.

As to other relevant structures, materials and process details are all the same as the first embodiment, and, therefore, these are not repeated hereinafter.

Third Embodiment

Figure 6:
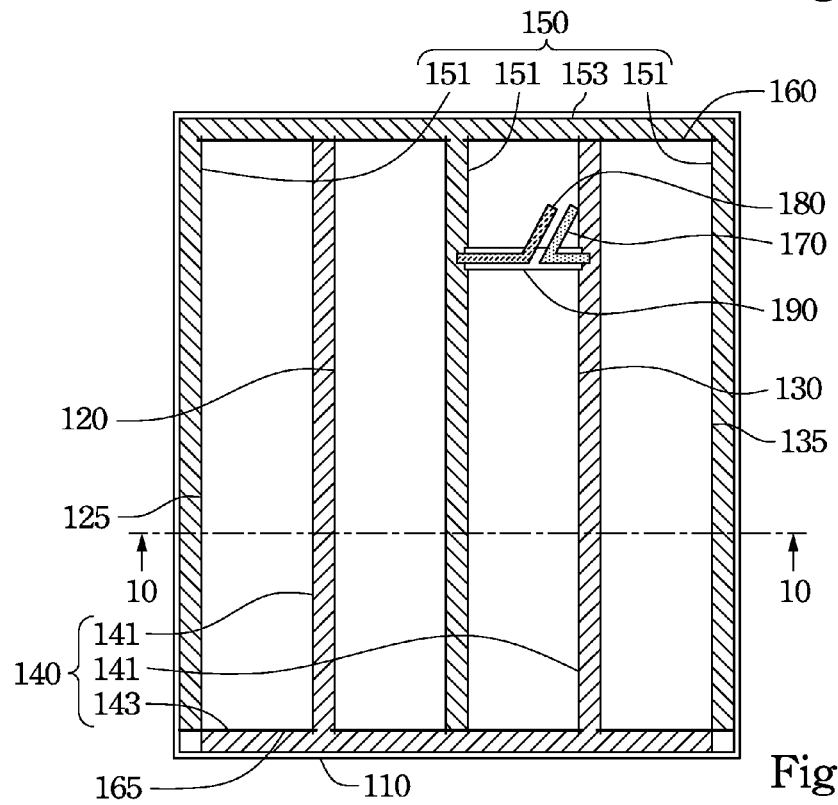
FIG. 6 is a top view of a photovoltaic module according to the third embodiment of the present invention.
Figure 10:
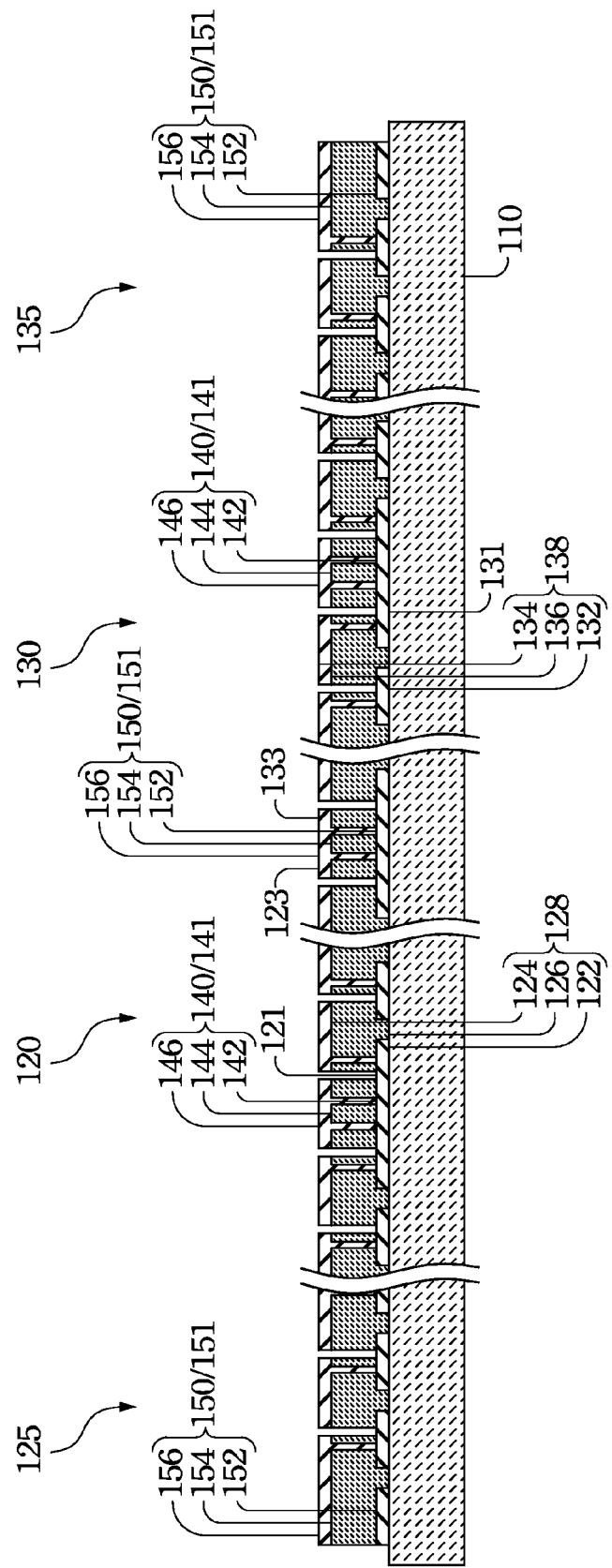
FIG. 10 is a sectional view taken along line 10-10 of FIG. 6.

FIG. 6 is a top view of a photovoltaic module according to the third embodiment of the present invention. FIG. 10 is a sectional view taken along line 10-10 of FIG. 6. The difference between the third embodiment and the first embodiment is that there are four cell sets such as the first cell set 120, the second cell set 130, a third cell set 125 and a fourth cell set 135 on the substrate 110 of the third embodiment. In this configuration, the first collecting electrode 140 may include a plurality of branch electrode parts 141 (there are two branch electrode parts 141 in FIG. 6) and a cross-connected electrode part 143. The branch electrode parts 141 are electrically connected to the bottom connecting electrodes 121/131 of the first cell set 120, the second cell set 130, the third cell set 125 and the fourth cell set 135 respectively, and the cross-connected electrode part 143 electrically connects the branch electrode parts 141.

Similarly, in the third embodiment, the electric isolation between the cross-connected electrode part 143 of the first collecting electrode 140 and the first cell set 120, the second cell set 130, the third cell set 125, the fourth cell set 135 and the second collecting electrode 150 is accomplished by an isolation line 165. The isolation line 165 is disposed between the cross-connected electrode part 143 of the first collecting electrode 140 and the first cell set 120, the second cell set 130, the third cell set 125, the fourth cell set 135 and the second collecting electrode 150 for electrically isolated therebetween. To be specific, the isolation line 165 may be a groove through all layers on the substrate 110. In manufacture, the manufacturers may utilize laser cutting, photolithography, or any combinations thereof to manufacture the isolation line 165.

The branch electrode parts 141 of the first collecting electrode 140 and the branch electrode parts 151 of the second collecting electrode 150 may be alternatively disposed at opposite sides of the first cell set 120, the second cell set 130, the third cell set 125 and the fourth cell set 135 in a comb arrangement. To be specific, in FIG. 6, the left side of the first cell set 120 is adjacent to the branch electrode part 141 of the first collecting electrode 140. The right side of the first cell set 120 is adjacent to the branch electrode part 151 of the second collecting electrode 150. The left side of the second cell set 130 is adjacent to the branch electrode part 151 of the second collecting electrode 150. The right side of the second cell set 130 is adjacent to the branch electrode part 141 of the first collecting electrode 140. The left side of the third cell set 125 is adjacent to the branch electrode part 151 of the second collecting electrode 150. The right side of the third cell set 125 is adjacent to the branch electrode part 141 of the first collecting electrode 140. The left side of the fourth cell set 135 is adjacent to the branch electrode part 141 of the first collecting electrode 140. The right side of the fourth cell set 135 is adjacent to the branch electrode part 151 of the second collecting electrode 150.

Namely, the branch electrode parts which both sides of any of the cell sets (for example, the first cell set 120, the second cell set 130, the third cell set 125 and the four cell set 135) are adjacent to belong to different collecting electrodes (for example, the first collecting electrode 140 and the second collecting electrode 150) which are responsible for the anode and cathode electric potentials respectively. In the third embodiment, the first collecting electrode 140 is responsible for the anode electric potential. The second collecting electrode 150 is responsible for the cathode electric potential. But, in other embodiments, the first collecting electrode 140 may be responsible for the cathode electric potential. The second collecting electrode 150 may be responsible for the anode electric potential.

In addition, in the third embodiment, the cross-connected electrode part 153 of the second collecting electrode 150 and the cross-connected electrode part 143 of the first collecting electrode 140 may be located at upper and bottom edges of the first cell set 120, the second cell set 130, the third cell set 125 and the fourth cell set 135. To be specific, as shown in FIG. 6, the cross-connected electrode part 143 of the first collecting electrode 140 may be located at the bottom edge of the first cell set 120, the second cell set 130, the third cell set 125 and the fourth cell set 135. The cross-connected electrode part 153 of the second collecting electrode 150 may be located at the upper edge of the first cell set 120, the second cell set 130, the third cell set 125 and the fourth cell set 135.

Therefore, in the third embodiment, the first collecting electrode 140 and the second collecting electrode 150 are disposed around the first cell set 120, the second cell set 130, the third cell set 125 and the fourth cell set 135 and are not across any cell unit of the first cell set 120, the second cell set 130, the third cell set 125 and the fourth cell set 135. Therefore, all cell units of the first cell set 120, the second cell set 130, the third cell set 125 and the fourth cell set 135 are used to generate electricity. No cell unit is shielded by ribbons and thus unable to generate electricity.

As to other relevant structures, materials and process details are all the same as the first embodiment, therefore, these are not repeated hereinafter.

Fourth Embodiment

Figure 7:
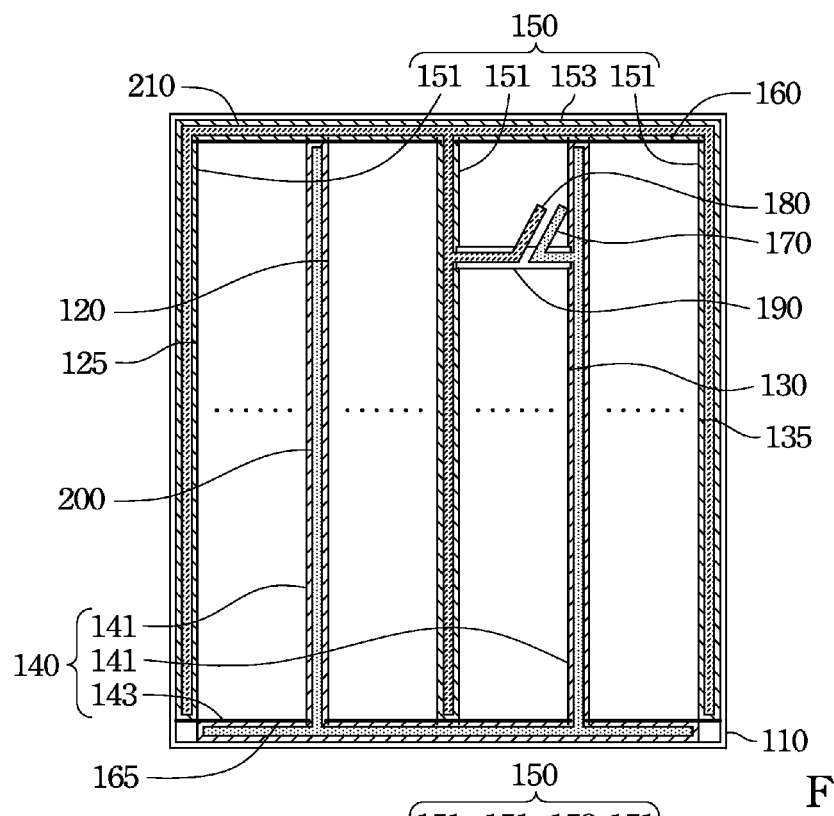
FIG. 7 is a top view of a photovoltaic module according to the fourth embodiment of the present invention.

FIG. 7 is a top view of a photovoltaic module according to the fourth embodiment of the present invention. The difference between the fourth embodiment and the third embodiment is that the photovoltaic module of the fourth embodiment further includes a first auxiliary electrode 200 and a second auxiliary electrode 210. The first auxiliary electrode 200 and the second auxiliary electrode 210 are disposed on the first collecting electrode 140 and the second collecting electrode 150 respectively and almost cover the entire area of the first collecting electrode 140 and the second collecting electrode 150 to improve the conductivity of the first collecting electrode 140 and the second collecting electrode 150.

In practice, the first auxiliary electrode 200 and the second auxiliary electrode 210 may be ribbons, photovoltaic ribbons, tin-plated copper tapes, tin-coated copper tapes, or any combinations thereof. It should be understood that the materials of the first auxiliary electrode 200 and the second auxiliary electrode 210 are for example only and should not limit the claimed scope of the present invention. The person having ordinary skill in the art may select a proper first auxiliary electrode and/or a second auxiliary electrode depending on actual requirements.

Similarly, for manufacturing convenience, the first auxiliary electrode 200 and the first leading-out electrode 170 may be an integrally formed ribbon. The second auxiliary electrode 210 and the second leading-out electrode 180 may be an integrally formed ribbon. However, these should not limit the claimed scope of the present invention. In other embodiments of the present invention, the first auxiliary electrode 200 and the first leading-out electrode 170 may be two independent ribbons electrically connected to each other, and the second auxiliary electrode 210 and the second leading-out electrode 180 may be two independent ribbons electrically connected to each other as well.

As to other relevant structures, materials and process details are all the same as the third embodiment, and, therefore, these are not repeated hereinafter.

Fifth Embodiment

Figure 8:
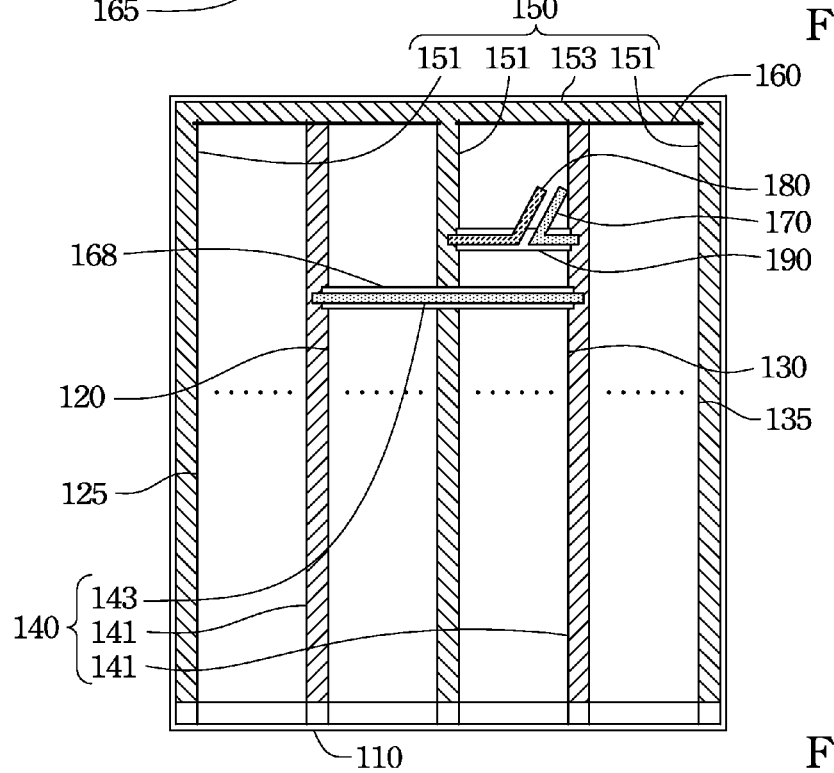
FIG. 8 is a top view of a photovoltaic module according to the fifth embodiment of the present invention.

FIG. 8 is a top view of a photovoltaic module according to the fifth embodiment of the present invention. The difference between the fifth embodiment and the third embodiment is that the cross-connected electrode part 143 of the first collecting electrode 140 is across at least a part of the cell sets (e.g., the first cell set 120 and the second cell set 130.) Namely, in the fifth embodiment, only the branch electrode parts 141 of the first collecting electrode 140, the second collecting electrode 150, the first cell set 120, the second cell set 130, the third cell set 125 and the fourth cell set 135 are substantially made of the same layer. The cross-connected electrode part 143 of the first collecting electrode 140 and a combination of the first cell set 120, the second cell set 130, the third cell set 125 and the fourth cell set 135 are not made of the same layer.

To be specific, the cross-connected electrode part 143 of the first collecting electrode 140 may be ribbons, photovoltaic ribbons, tin-plated copper tapes, tin-coated copper tapes, or any combinations thereof. It should be understood that the materials of the cross-connected electrode part 143 are for example only and should not limit the claimed scope of the present invention. The person having ordinary skill in the art may select a proper cross-connected electrode part depending on actual requirements.

In the fifth embodiment, the electric isolation between the cross-connected electrode part 143 and a combination of the first cell set 120, the second cell set 130 and the second collecting electrode 150 is accomplished by a patterned insulation layer 168. The patterned insulation layer 168 is disposed between the combination of the first cell set 120, the second cell set 130 and the second collecting electrode 150 and the cross-connected electrode part 143.

As to other relevant structures, materials and process details are all the same as the third embodiment, and, therefore, these are not repeated hereinafter.

Sixth Embodiment

Figure 9:
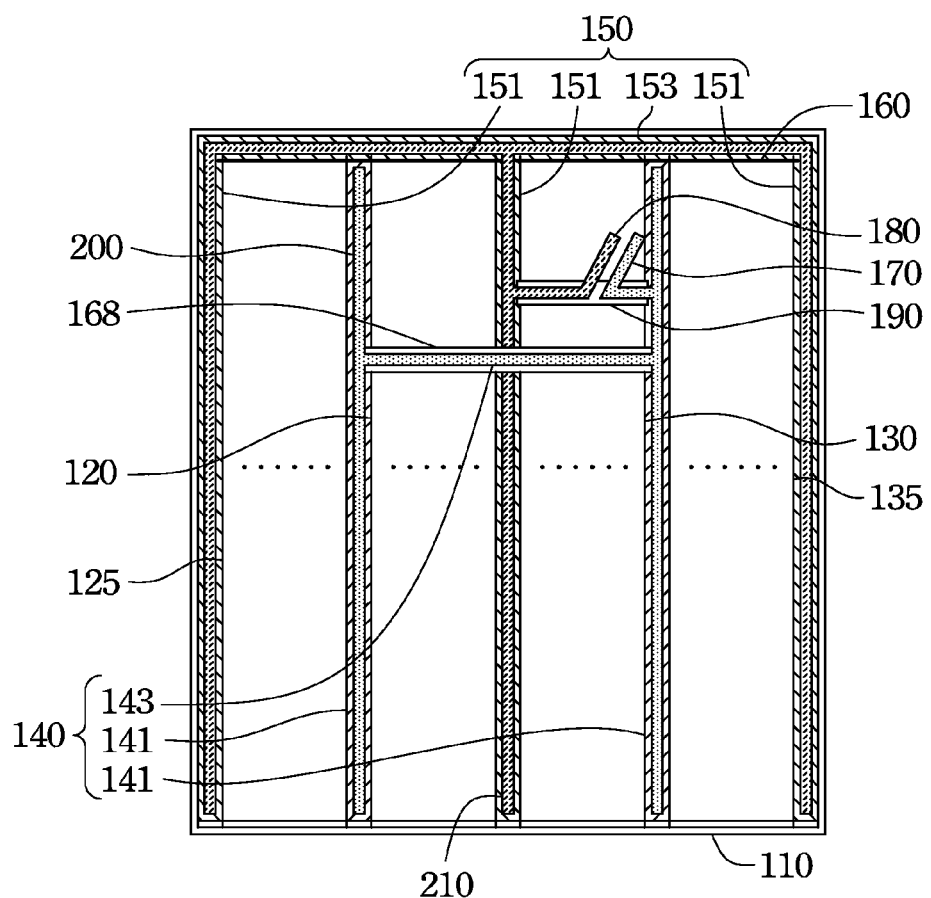
FIG. 9 is a top view of a photovoltaic module according to the sixth embodiment of the present invention.

FIG. 9 is a top view of a photovoltaic module according to the sixth embodiment of the present invention. The difference between the sixth embodiment and the fifth embodiment is that the photovoltaic module of the sixth embodiment may further include a first auxiliary electrode 200 and a second auxiliary electrode 210. The first auxiliary electrode 200 and the second auxiliary electrode 210 are disposed on the first collecting electrode 140 and the second collecting electrode 150 respectively and almost cover the entire area of to the first collecting electrode 140 and the second collecting electrode 150 to improve the conductivity of the first collecting electrode 140 and the second collecting electrode 150.

In practice, the first auxiliary electrode 200 and the second auxiliary electrode 210 may be ribbons, photovoltaic ribbons, tin-plated copper tapes, tin-coated copper tapes, or any combinations thereof. It should be understood that the materials of the first auxiliary electrode 200 and the second auxiliary electrode 210 are for example only and should not limit the claimed scope of the present invention. The person having ordinary skill in the art may select a proper first auxiliary electrode and/or a second auxiliary electrode depending on actual requirements.

Similarly, for manufacturing convenience, the first auxiliary electrode 200 and the first leading-out electrode 170 may be an integrally formed ribbon. The second auxiliary electrode 210 and the second leading-out electrode 180 may be an integrally formed ribbon. However, these should not limit the claimed scope of the present invention. In other embodiments of the present invention, the first auxiliary electrode 200 and the first leading-out electrode 170 may be two independent ribbons electrically connected to each other, and the second auxiliary electrode 210 and the second leading-out electrode 180 may be two independent ribbons electrically connected to each other as well.

In addition, the cross-connected electrode part 143 and the first auxiliary electrode 200 may be an integrally formed ribbon as well. But these should not limit the claimed scope of the present invention. In other embodiments of the present invention, the cross-connected electrode part 143 and the first auxiliary electrode 200 may be two independent ribbons electrically connected to each to other.

As to other relevant structures, materials and process details are all the same as the fifth embodiment, and, therefore, these are not repeated hereinafter.

In conclusion, the present invention provides a photovoltaic module having a plurality of cell sets electrically connected in parallel to supply a stable and large photocurrent. The photovoltaic module of the present invention has at least a collecting electrode and a plurality of cell sets, wherein the collecting electrode and the cell set are substantially made of substantially the same layer. The compacted photovoltaic module of the present invention makes the structure simple and stable, and the manufacture cost can be therefore reduced. Therefore, attach additional ribbons on the collecting electrodes can be unnecessary so that the complexity of the lay-up structure can be reduced, and thus the process yield problem resulting from the overcomplicated lay-up structure may be further improved. In addition, the hardware cost and the module cost can be further reduced as well.

Although the embodiments are disclosed as the above, these are not limitations to the present invention. Any person skilled in the art can make modification and decoration under the main idea and scope. Therefore, the protective range of the present invention depends on the following claim.

What is claimed is:

1. A photovoltaic module comprising:
a substrate;
a first cell set disposed on the substrate, the first cell set comprising a plurality of first cell units, a first bottom connecting electrode and a first upper connecting electrode, the plurality of first cell units being electrically connected to each other in series, wherein the first cell units are electrically connected between the first bottom connecting electrode and the first upper connecting electrode;
a second cell set disposed on the substrate, the second cell set comprising a plurality of second cell units, a second bottom connecting electrode and a second upper connecting electrode, the plurality of second cell units being electrically connected to each other in series, wherein the second cell units are electrically connected between the second bottom connecting electrode and the second upper connecting electrode;
a first collecting electrode disposed between the first cell set and the second cell set and electrically connecting the first bottom connecting electrode and the second bottom connecting electrode; and
a second collecting electrode disposed on the substrate and electrically connecting the first upper connecting electrode and the second upper connecting electrode, wherein the first collecting electrode, the second collecting electrode, the first cell set and the second cell set are substantially made of the same layer, wherein the second collecting electrode comprises two branch electrode parts electrically connected to the first upper connecting electrode and the second upper connecting electrode and a cross-connected electrode part electrically connecting the two branch electrode parts; and
an isolation line disposed between the cross-connected electrode part of the second collecting electrode and the first cell set and the second cell set.

2. The photovoltaic module of claim 1, wherein the substrate comprises a transparent substrate, a glass substrate, a plastic substrate, a silicon substrate, a flexible substrate or any combinations thereof.

3. The photovoltaic module of claim 1, wherein each of the first cell units and the second cell units comprises:
a transparent electrode;
a back electrode; and
a photovoltaic layer located between the transparent electrode and the back electrode.

4. The photovoltaic module of claim 3, wherein one of the transparent electrode and the back electrode is disposed on the substrate.

5. The photovoltaic module of claim 3, wherein the first bottom connecting electrode is connected to one of the transparent electrode and the back electrode, and the first upper connecting electrode is connected to the other of the transparent electrode and the back electrode.

6. The photovoltaic module of claim 1, wherein the second collecting electrode is disposed around the first cell set and the second cell set.

7. The photovoltaic module of claim 1, wherein the second collecting electrode is not across the first cell set and the second cell set.

8. The photovoltaic module of claim 1, wherein the second collecting electrode is an integrally formed conductive layer.

9. The photovoltaic module of claim 1, wherein the second collecting electrode comprises a stack of a transparent conductive layer, a photovoltaic layer and a conductive metal layer.

10. The photovoltaic module of claim 1, wherein the first collecting electrode comprises a stack of a transparent conductive layer, a photovoltaic layer and a conductive metal layer.

11. The photovoltaic module of claim 1, further comprising:
a first leading-out electrode electrically connected to the first collecting electrode;
a second leading-out electrode electrically connected to the second collecting electrode; and a patterned insulation layer disposed between a combination of the first leading-out electrode and the second leading-out electrode and another combination of the first cell set and the second cell set.

12. The photovoltaic module of claim 1, further comprising a first auxiliary electrode and a second auxiliary electrode respectively disposed on the first collecting electrode and the second collecting electrode.

13. A photovoltaic module comprising:
   a substrate;
   a plurality of cell sets disposed on the substrate, each of the cell sets comprising a plurality of cell units, a bottom connecting electrode and an upper connecting electrode, the plurality of cell units being electrically connected to each other in series, wherein the cell units are electrically connected between the bottom connecting electrode and the upper connecting electrode;
   a first collecting electrode disposed on the substrate and electrically connected to the bottom connecting electrode of every cell set; and
   a second collecting electrode disposed on the substrate and electrically connected to the upper connecting electrode of every cell set, wherein the second collecting electrode and the cell sets are substantially made of the same layer.

14. The photovoltaic module of claim 13, wherein the substrate comprises a transparent substrate, a glass substrate, a plastic substrate, a silicon substrate, a flexible substrate or any combinations thereof.

15. The photovoltaic module of claim 13, wherein each of the cell units comprises:
   a transparent electrode;
   a back electrode; and
   a photovoltaic layer located between the transparent electrode and the back electrode.

16. The photovoltaic module of claim 15, wherein one of the transparent electrode and the back electrode is disposed on the substrate.

17. The photovoltaic module of claim 15, wherein the bottom connecting electrode is connected to one of the transparent electrode and the back electrode, and the upper connecting electrode is connected to the other of the transparent electrode and the back electrode.

18. The photovoltaic module of claim 13, wherein the first collecting electrode comprises a stack of a transparent conductive layer, a photovoltaic layer and a conductive metal layer.

19. The photovoltaic module of claim 13, wherein the first collecting electrode comprises a plurality of branch electrode parts electrically connected to the upper connecting electrodes and a cross-connected electrode part electrically connecting the branch electrode parts.

20. The photovoltaic module of claim 19, further comprising an isolation line disposed between the cell sets and the cross-connected electrode part of the first collecting electrode for electrically isolated therebetween.

21. The photovoltaic module of claim 13, wherein the first collecting electrode is an integrally formed conductive layer.

22. The photovoltaic module of claim 13, wherein the first collecting electrode is not across the cell sets.

23. The photovoltaic module of claim 13, wherein the second collecting electrode comprises a stack of a transparent conductive layer, a photovoltaic layer and a conductive metal layer.

24. The photovoltaic module of claim 13, wherein the second collecting electrode comprises a plurality of branch electrode parts electrically connected to the upper connecting electrodes and a cross-connected electrode part electrically connecting the branch electrode parts.

25. The photovoltaic module of claim 24, further comprising an isolation line disposed between the cell sets and the cross-connected electrode part of the second collecting electrode for electrically isolated therebetween.

26. The photovoltaic module of claim 13, wherein the second collecting electrode is not across the cell sets.

27. The photovoltaic module of claim 13, wherein the first collecting electrode is across at least a part of the cell sets.

28. The photovoltaic module of claim 13, wherein the second collecting electrode is an integrally formed conductive layer.

29. The photovoltaic module of claim 13, further comprising
   a first leading-out electrode electrically connected to the first collecting electrode;
   a second leading-out electrode electrically connected to the second collecting electrode; and
   a patterned insulation layer disposed between a combination of the first leading-out electrode and the second leading-out electrode and the cell sets.

30. The photovoltaic module of claim 13, further comprising a first auxiliary electrode and a second auxiliary electrode respectively disposed on the first collecting electrode and the second collecting electrode.

* * * * *